United States Patent
Chen et al.

(10) Patent No.: US 10,887,499 B2
(45) Date of Patent: Jan. 5, 2021

(54) CAMERA ASSEMBLY AND PACKAGING METHODS THEREOF, LENS MODULE, AND ELECTRONIC DEVICE

(71) Applicant: Ningbo Semiconductor International Corporation, Ningbo (CN)

(72) Inventors: Da Chen, Ningbo (CN); Mengbin Liu, Ningbo (CN)

(73) Assignee: Ningbo Semiconductor International Corporation, Ningbo (CN)

( * ) Notice: Subject to any disclaimer, the term of this patent is extended or adjusted under 35 U.S.C. 154(b) by 6 days.

(21) Appl. No.: 16/235,414

(22) Filed: Dec. 28, 2018

(65) Prior Publication Data

US 2020/0162645 A1    May 21, 2020

Related U.S. Application Data

(63) Continuation of application No. PCT/CN2018/119982, filed on Dec. 10, 2018.

(30) Foreign Application Priority Data

Nov. 20, 2018  (CN) ........................... 2018 1 1385643

(51) Int. Cl.
*H01L 27/146* (2006.01)
*H04N 5/225* (2006.01)

(52) U.S. Cl.
CPC ......... *H04N 5/2254* (2013.01); *H01L 27/146* (2013.01); *H04N 5/2252* (2013.01);
(Continued)

(58) Field of Classification Search
CPC .. H04N 5/2254; H04N 5/2253; H04N 5/2252; H04N 5/372–3728; H01L 27/148–14893; H01L 27/146–14656
See application file for complete search history.

(56) References Cited

U.S. PATENT DOCUMENTS 9,935,144 B1 *   4/2018 Lin ................... H01L 27/14636
2010/0187557 A1 *   7/2010 Samoilov ............. H01L 23/481
257/99
(Continued)

FOREIGN PATENT DOCUMENTS

CN         103456754 A    12/2013
CN         103700634 A     4/2014
(Continued)

*Primary Examiner* — Abdelaaziz Tissire
(74) *Attorney, Agent, or Firm* — Anova Law Group, PLLC

(57) ABSTRACT

The present disclosure provides a method for packaging a camera assembly. The method includes providing a photosensitive chip having a plurality of first soldering pads; mounting a filter on the photosensitive chip; providing a first carrier substrate; and bonding a plurality of functional components and the photosensitive chip to the first carrier substrate. The plurality of functional components has a plurality of second soldering pads, and the first soldering pads and the second soldering pads all face away from the first carrier substrate. The method includes forming an encapsulation layer to cover the first carrier substrate, the photosensitive chip, and the functional components. The encapsulation layer exposes the filter. The method further includes forming a redistribution layer structure, on one side of the encapsulation layer close to the filter, to electrically connect to the first soldering pads and the second soldering pads; and removing the first carrier substrate.

20 Claims, 7 Drawing Sheets

(52) U.S. Cl.
CPC ....... *H04N 5/2253* (2013.01); *H01L 27/1469* (2013.01); *H01L 27/14636* (2013.01); *H01L 27/14687* (2013.01)

(56) References Cited

U.S. PATENT DOCUMENTS

| | | | |
|---|---|---|---|
| 2012/0038813 A1 | 2/2012 | Jung et al. | |
| 2013/0320471 A1* | 12/2013 | Luan | H01L 27/14618 257/432 |
| 2014/0055654 A1* | 2/2014 | Borthakur | H01L 27/14616 348/302 |
| 2014/0375876 A1* | 12/2014 | Ikemoto | H05K 1/182 348/373 |
| 2015/0373854 A1* | 12/2015 | Ikemoto | H04N 5/2257 361/767 |
| 2017/0142308 A1* | 5/2017 | Wang | H04N 5/2257 |
| 2018/0366385 A1* | 12/2018 | Hashimoto | H01L 24/94 |
| 2019/0174087 A1* | 6/2019 | Kim | G02B 27/646 |
| 2020/0161289 A1* | 5/2020 | Chen | H04N 5/2254 |
| 2020/0161346 A1* | 5/2020 | Chen | H01L 27/1469 |
| 2020/0161350 A1* | 5/2020 | Chen | H01L 27/14625 |
| 2020/0161356 A1* | 5/2020 | Chen | H01L 21/56 |
| 2020/0161359 A1* | 5/2020 | Chen | H01L 27/14634 |

FOREIGN PATENT DOCUMENTS

| | | |
|---|---|---|
| CN | 203895459 U | 10/2014 |
| CN | 105244359 A | 1/2016 |
| CN | 106206485 A | 12/2016 |
| CN | 107958881 A | 4/2018 |

\* cited by examiner

CAMERA ASSEMBLY AND PACKAGING METHODS THEREOF, LENS MODULE, AND ELECTRONIC DEVICE

CROSS-REFERENCES TO RELATED APPLICATIONS

This application is a continuation application of PCT patent application No. PCT/CN2018/119982, filed on Dec. 10, 2018, which claims the priority of Chinese patent application No. CN201811385643.7, filed on Nov. 20, 2018, the entire content of which is incorporated herein by reference.

FIELD OF THE DISCLOSURE

The present disclosure generally relates to the field of semiconductor fabrication technology and, more particularly, relates to a camera assembly and packaging method thereof, a lens module, and an electronic device.

BACKGROUND

Nowadays, photography has become a common way for people to record their activities. Therefore, electronic devices (such as mobile phones, tablets, cameras, etc.) with picture-capturing functions are increasingly used and have become indispensable tools for people in today's daily life and work.

Electronic devices with picture-capturing functions are usually equipped with lens modules. The design level of the lens modules is one of the important factors for determining the quality of the captured pictures and videos. A lens module usually includes a photosensitive assembly containing a photosensitive chip, and a lens assembly fixed above the photosensitive assembly and configured to create an image of the subject to be captured.

Moreover, in order to improve the imaging capability of the lens module, a photosensitive chip with a larger imaging area is required, and passive components such as resistors, capacitors, etc. and peripheral chips often need to be disposed in the lens module as well.

However, the performance of the lens module may still need to be improved and the total thickness of the lens module may also need to be reduced. The disclosed camera assembly and packaging method thereof, the disclosed lens module, and the disclosed electronic device are directed to solve one or more problems set forth above and other problems in the art.

BRIEF SUMMARY OF THE DISCLOSURE

One aspect of the present disclosure provides a method for packaging a camera assembly. The method includes providing a photosensitive chip having a plurality of first soldering pads; mounting a filter on the photosensitive chip; providing a first carrier substrate; and bonding a plurality of functional components and the photosensitive chip to the first carrier substrate. The plurality of functional components has a plurality of second soldering pads, and the plurality of first soldering pads and the plurality of second soldering pads all face away from the first carrier substrate. The method also includes forming an encapsulation layer to cover the first carrier substrate, the photosensitive chip, and the functional components. The encapsulation layer exposes the filter. The method further includes forming a redistribution layer (RDL) structure, on one side of the encapsulation layer close to the filter, to electrically connect to the plurality of first soldering pads and the plurality of second soldering pads; and removing the first carrier substrate.

Another aspect of the present disclosure provides a camera assembly. The camera assembly includes an encapsulation layer; and a photosensitive unit and a plurality of functional components embedded in the encapsulation layer. The photosensitive unit includes a photosensitive chip, and a filter mounted on the photosensitive chip. The bottom surface of the photosensitive layer exposes the photosensitive chip and the plurality of functional components. The photosensitive chip has a plurality of first soldering pads, the plurality of functional components has a plurality of second soldering pads, and the plurality of first soldering pads and the plurality of second soldering pads all face away from the first carrier substrate. The camera assembly further includes an RDL structure, located on one side of the encapsulation layer close to the filter and electrically connected to the plurality of first soldering pads and the plurality of second soldering pads.

Another aspect of the present disclosure provides a lens module. The lens module includes a camera assembly according the present disclosure. The lens module also includes a lens assembly, including a holder. The holder is mounted on the top surface of the encapsulation layer and surrounds the photosensitive chip and the plurality of functional components, and the lens assembly is electrically connected to the photosensitive chip and the plurality of functional components.

Another aspect of the present disclosure provides an electronic device. The electronic device includes a lens module according to the present disclosure.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
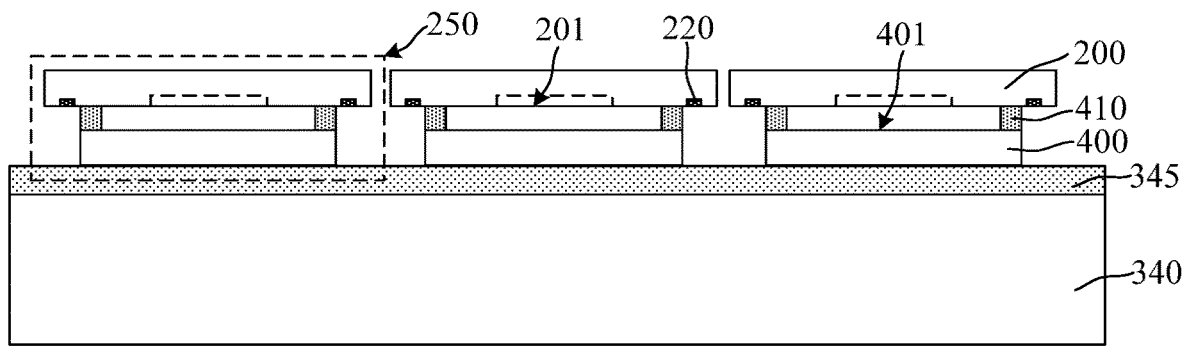
FIGS. 1-13 illustrate schematic views of structures at certain stages of an exemplary method for packaging a camera assembly according to various embodiments of the present disclosure.

In the following description, numerous specific details are set forth to provide a more thorough understanding of the disclosure. However, it will be apparent to those skilled in the art that the present disclosure may be implemented without one or more of these details. In other instances, some of the technical features well known in the art are described herein to avoid confusion with the present disclosure.

It should be understood that the disclosed methods and structures can be implemented in various forms and should not be construed as limited to the embodiments set forth in the present disclosure. Instead, these embodiments are provided so that the present disclosure will be thorough and complete. In the accompanying drawings, the size and relative dimensions of the layers and regions may be enlarged for clarity. The same reference numbers indicate the same elements throughout the present disclosure.

It should be understood that when an element or layer is referred to as "on", "adjacent to", "connected to" or "coupled to" another element or layer, it may be directly placed on the other element or layer, or may be adjacent to, connected to, or coupled to the other element or layer. Alternatively, the element or layer may be indirectly placed on the other element or layer, or may be adjacent to, connected to, or coupled to the other element or layer as some intermediate elements and/or layers are disposed between. In contrast, when an element is referred to as "directly on", "directly adjacent to", "directly connected to", or "directly coupled to" another element or layer, no intermediate element or layer is disposed between.

It should be understood that although the terms such as first, second, third, etc. are used to describe various components, regions, layers, and/or portions, these components, regions, layers, and/or portions should not be limited by the terms of first, second, third, etc. These terms are merely used to distinguish an element, component, region, layer, or portion. Therefore, a first element, component, region, layer, or portion discussed in the present disclosure may be alternatively represented as a second element, component, region, layer, or portion.

Spatial relationship terms such as "under", "below", "the lower", "underneath", "above", "the upper", etc. are used here for illustrative purposes. The terms may be used to describe the relationship of one element or feature shown in a figure with respect to other elements or features. It should be understood that in addition to the orientation shown in the figures, the spatially relative terms are intended to encompass different orientations of the device in use and operation. For example, when a device in the figures is flipped, an element or feature described as "under another element", "under", or "below" may be oriented "above" the other element or feature. Thus, the exemplary terms "below" and "under" may include both up and down directions. A device may be otherwise oriented (e.g. rotated by 90 degrees or oriented to other orientation), and the spatial descriptive terms used herein may be interpreted accordingly.

The terms used herein are merely for the purpose of describing the particular embodiments and are not intended to limit the scope of the present disclosure. When using the singular forms such as "a", "one", and "the/this", these terms are also intended to include the plural forms, unless otherwise specified in the context. It should also be understood that when the terms "composed of" and/or "comprising" are used in the specification, they are intended to describe the presence of features, integers, steps, operations, elements, and/or components, but not to exclude the presence or addition of one or more other features, integers, steps, operations, elements, components, and/or groups. When used in the present disclosure, the term "and/or" includes any and all combinations of the listed related items.

Various embodiments of the present disclosure are described herein with reference to schematic illustrations of cross-sectional views of the structures (and intermediate structures) according to the preferred embodiments of the present disclosure. Thus, deviations from the illustrated shapes may be expected due to, e.g. manufacturing techniques and/or tolerances. Therefore, the embodiments of the present disclosure should not be limited to the specific shapes of the regions illustrated herein, but should include variations in the shapes due to, e.g. manufacturing. For example, an implanted region shown as a rectangle typically has rounded or curved features and/or an implantation gradient at the edges, rather than has a binary change from the implanted region to the non-implanted region. Similarly, a buried region formed by implantation can result in some implantation in the region between the buried region and the surface through which the implantation is performed. Therefore, the regions shown in the figures are illustrative and the shapes of the regions are not intended to represent the actual shapes of the regions of the device, and thus, the shapes of the regions are not intended to limit the scope of the present disclosure.

In order to make the present disclosure easy to understand, detailed steps and structures will be provided to explain the technical solutions of the present disclosure. In the following, various preferred embodiments of the present disclosure are described in detail. However, it should be noted that in addition to the embodiments described herein, the present disclosure may be implemented in other forms.

Currently, the performance of the lens modules needs to be improved, and the lens modules are difficult to meet the requirements for miniaturization and thinning. In the following, an example of a lens module will be provided to describe the reason why the lens module needs to be improved.

A traditional lens module mainly includes a circuit board, a photosensitive chip, a plurality of functional components (for example, peripheral chips), and a lens assembly. The plurality of functional components is usually mounted on a peripheral main board, and the photosensitive chip is separated from the plurality of functional components. The circuit board is used to provide support for the photosensitive chip, the plurality of functional components, and the lens assembly. Moreover, the photosensitive chip, the plurality of functional components, and the lens assembly may be electrically connected to each other through the circuit board.

However, because of the demands of high-resolution pixels and ultra-thin lens modules, the requirements on the imaging performance of the lens modules become more and more strict. Correspondingly, the area of the photosensitive chip becomes larger, and the number of functional components included also increases. Therefore, the dimension of the lens modules becomes larger and larger, which may be adverse to meeting the requirements for miniaturization and thinning of lens modules.

In addition, the photosensitive chip in a lens module is usually disposed inside a holder, and the peripheral chip is usually disposed outside the holder. Therefore, there is a certain distance from the peripheral chip to the photosensitive chip, and thus the signal transmission speed may be reduced. Moreover, because the peripheral chip usually includes a digital signal processor (DSP) and a memory, the large distance between the peripheral chip and the photosensitive chip may easily have adverse effect on the shooting speed and the saving speed, thereby degrading the performance of the lens module.

In order to solve the technical problem, according to the present disclosure, the photosensitive chip and the functional components are integrated in an encapsulation layer, and electrical connections are established through a redistribution structure. Compared to the method in which the peripheral chip is mounted on a peripheral main board, the disclosed method may be able to reduce the distance between the photosensitive chip and each functional component, and thus may be conducive to reducing the length of the electrical connection between the photosensitive chip and the functional component. As such, the signal transmission speed may be improved, which in turn may improve the performance of the lens module. Moreover, through the formation of the encapsulation layer and the redistribution structure, the circuit board may not be a must-have component, that is, the circuit board may be omitted. As such, the total thickness of the lens module may be reduced, which may be conducive to meeting the requirements for miniaturization and thinning of the lens module.

In the following, in order to make the objects, features, and advantages described above more apparent, various embodiments of the present disclosure will be described in detail with reference to the accompanying drawings.

Figure 20:
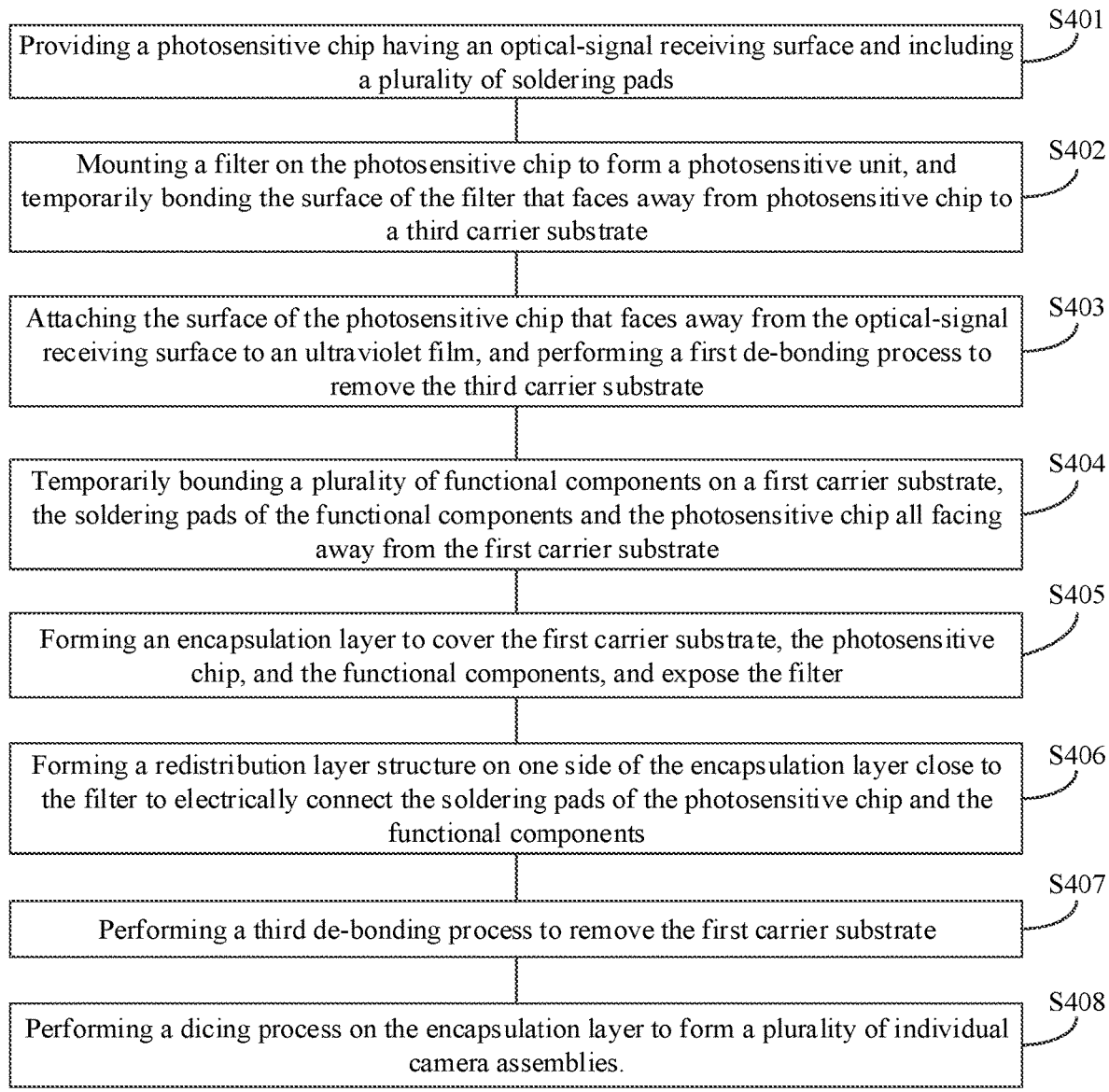
FIG. 20 illustrates a flowchart of an exemplary method for packaging a camera assembly according to various embodiments of the present disclosure.

FIG. 20 illustrates a flowchart of an exemplary method for packaging a camera assembly according to various embodiments of the present disclosure. FIGS. 1-13 illustrate schematic views of structures at certain stages of the exemplary method.

Figure 2:
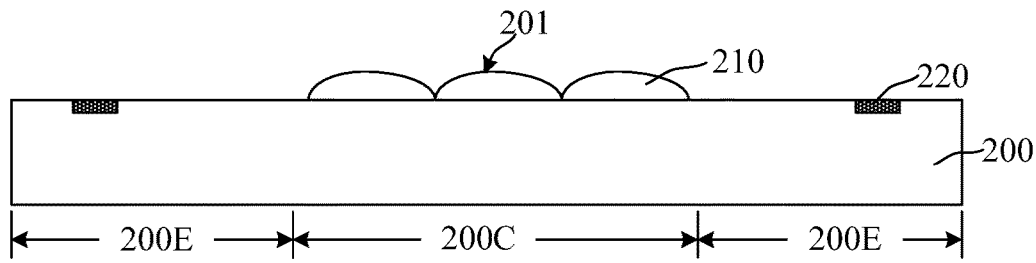

Referring to FIG. 20, a photosensitive chip having an optical-signal receiving surface and including a plurality of soldering pads may be provided (S401). FIG. 1 illustrates a schematic cross-sectional view of a structure consistent with various embodiments of the present disclosure. FIG. 2 illustrates an enlarge view of a photosensitive chip in the structure shown in FIG. 1.

Referring to FIGS. 1-2, a photosensitive chip 200 may be provided. A plurality of soldering pads may be formed on the photosensitive chip 200.

The photosensitive chip 200 may be an image sensor chip. In one embodiment, the photosensitive chip 200 is a complementary metal-oxide-semiconductor (CMOS) image sensor chip. In other embodiments, the photosensitive chip 200 may be a charge coupled device (CCD) image sensor chip.

In one embodiment, the photosensitive chip 200 may have an optical-signal receiving surface 201 (referring to FIG. 2), and the photosensitive chip 200 may receive and sense optical-radiation signal.

For example, the photosensitive chip 200 may include a photosensitive region 200C and a peripheral region 200E surrounding the photosensitive region 200C. The optical-signal receiving surface 201 may be located in the photosensitive region 200C.

The photosensitive chip 200 may include a plurality of pixel units. Therefore, the photosensitive chip 200 may include a plurality of semiconductor photosensitive devices (not shown), and a plurality of filter films (not shown) disposed on the plurality of semiconductor photosensitive devices. The plurality of filter films may be used for selectively absorbing and transmitting the optical signals received by the optical-signal receiving surface 201. The photosensitive chip 200 may also include a plurality of microlenses 210 disposed on the plurality of filter films. The plurality of microlenses 210 may have a one-on-one correspondence with the plurality of semiconductor photosensitive devices, such that the received light beams for generating optical radiation signals may be focused onto the plurality of semiconductor photosensitive devices. Correspondingly, the optical-signal receiving surface 201 may be the top surface of the plurality of microlenses 210.

It should be noted that the photosensitive chip 200 is usually a silicon-based chip, and thus may be fabricated by an integrated circuit (IC) fabrication technique. The photosensitive chip 200 may have a plurality of soldering pads for realizing electrical connection between the photosensitive chip 200 and other chips and/or components. In one embodiment, the photosensitive chip 200 may have a plurality of first chip soldering pads 220 formed in the peripheral region 200E.

In one embodiment, the first chip soldering pads 220 may be exposed on the surface of the photosensitive chip 200 on the same side of the optical-signal receiving surface 201.

Figure 3:
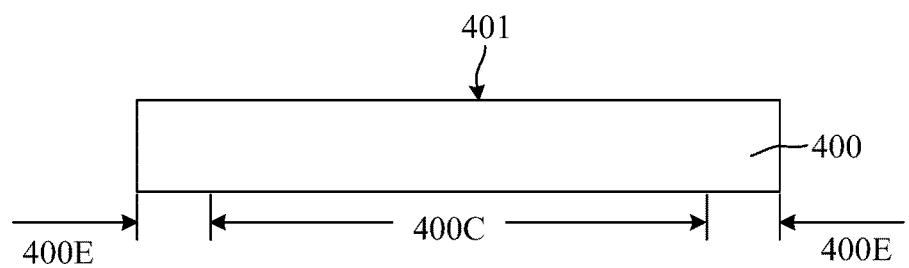

Further, returning to FIG. 20, a filter may be mounted on the photosensitive chip to form a photosensitive unit, and the surface of the filter that faces away from the photosensitive chip may be bonded to a third carrier substrate (S402). FIG. 3 illustrates an enlarged view of a filter in the structure shown in FIG. 1.

Referring to FIGS. 1-3, a filter 400 (referring to FIG. 1) may be mounted on the photosensitive chip 200. As the filter 400 is mounted on the photosensitive chip 200, a photosensitive unit 250 (referring to FIG. 1) may be formed. Mounting the filter 400 on the photosensitive chip 200 may not only be able to prevent the subsequent packaging process from generating contamination on the optical-signal receiving surface 201, but also be conducive to reducing the overall thickness of the subsequently-formed lens module, thereby meeting the requirements for miniaturization and thinning of the lens module.

The filter 400 may be an infrared-radiation (IR) filter glass or a fully transparent glass. In one embodiment, the filter 400 may be an IR filter glass. Therefore, the filter 400 may also be used to eliminate the influence of IR in the incident light on the performance of the photosensitive chip 200, which may be conducive to improving the imaging effect.

For example, the filter 400 may be an infrared-radiation cut filter (IRCF). The IRCF may be a blue-glass IRCF, or may include a glass and an IR cut coating disposed on the surface of the glass.

In one embodiment, the filter 400 may include a to-be-bonded surface 401. The to-be-bonded surface 401 may be the surface used for mounting with the photosensitive chip 200, that is, the surface that faces the photosensitive chip 200.

For example, when the filter 400 is a blue-glass IRCF, a surface of the blue-glass IRCF may be coated with a transmission-enhancement film or an anti-reflection film (not shown), and accordingly, the surface of the blue-glass IRCF that is in opposite to the transmission-enhancement film or the anti-reflection film may be the to-be-bonded surface 401. When the filter 400 includes a glass and an IR cut coating disposed on the surface of the glass, the surface of the glass that is in opposite to the IR cut coating may be the to-be-bonded surface 401. In other embodiments, when the filter is a fully transparent glass, either surface of the fully transparent glass can be used as the to-be-bonded surface.

Referring to FIG. 3, the filter 400 may include a transparent region 400C and a boundary region 400E surrounding the transparent region 400C. The transparent region 400C may be used to allow the external light to pass through, such that the optical-signal receiving surface 201 of the photosensitive chip 200 may be able to receive optical signals, ensuring the normal operation function of the lens module. The boundary region 400E may be used to reserve a space for subsequently mounting the filter 400 and the photosensitive chip 200.

Referring to FIG. 1, in one embodiment, the filter 400 may be mounted on the photosensitive chip 200 through a bonding structure 410. The bonding structure 410 may surround the optical-signal receiving surface 201.

The bonding structure 410 may be used to realize physical connection between the filter 400 and the photosensitive chip 200. Moreover, the filter 400, the bonding structure 410, and the photosensitive chip may together enclose a cavity (not labeled), preventing the filter 400 directly contacting with the photosensitive chip 200. Therefore, the filter 400 may be prevented from causing adverse effect on the performance of the photosensitive chip 200.

In one embodiment, the bonding structure 410 may surround the optical-signal receiving surface 201, such that the filter 400 disposed above the optical-signal receiving surface 201 may be located in the photosensitive path of the photosensitive chip 200, thereby ensuring the performance of the photosensitive chip 200.

For example, the bonding structure 410 may be made of photolithographic material. Therefore, the bonding structure 410 may be formed through a photolithography process, which may not only improve the topography quality and the dimensional accuracy of the bonding structure 410, but also improve the packaging efficiency and the production capacity. In addition, the influence on the bonding strength of the bonding layer 300 may also be reduced.

In one embodiment, the bonding structure 410 may be a photolithographic dry film. In other embodiments, the bonding structure may be made of photolithographic polyimide, photolithographic polybenzoxazole (PBO), or photolithographic benzocyclobutene (BCB).

In one embodiment, in order to reduce the process difficulty for forming the bonding structure 410, simplify the process steps, and reduce the influence of the fabrication process of the bonding structure 410 on the optical-signal receiving surface 201, the bonding structure 410 may be formed on the filter 400.

For example, referring to FIG. 1, the mounting step may include the following exemplary steps. A third carrier substrate 340 may be provided. The surface of the filter 400 that faces away from the to-be-bonded surface 401 may be temporarily bonded to the third carrier substrate 340. After the temporary bonding step, a ring-shaped bonding structure 410 may be formed in the boundary region 400E (referring to FIG. 3) of the filter 400. The optical-signal receiving surface 201 of the photosensitive chip 200 may be arranged to face the ring-shaped bonding structure 410, such that the peripheral region 200E (referring to FIG. 2) of the photosensitive chip 200 may be mounted with the ring-shaped bonding structure 410 to form the photosensitive unit 250.

The third carrier substrate 340 may be used to provide a process platform for the mounting step, such that the process operability may be improved. In one embodiment, the third carrier substrate 340 may be a carrier wafer. In other embodiments, the third carrier substrate may be any other appropriate type of substrate.

In one embodiment, the filter 400 may be temporarily bonded to the third carrier substrate 340 through a first temporary bonding layer 345. The first temporary bonding layer 345 may act as a peeling layer to facilitate a subsequent de-bonding process.

In one embodiment, the first temporary bonding layer 345 may be a foamed film. The foamed film may include a micro-adhesive surface and a foamed surface. The foamed film may demonstrate adhesive ability at room temperature. After the foamed film is attached to the third carrier substrate 340, the foamed film may lose the adhesive property when the foamed film is heated in a subsequent process, and thus de-bonding process may be implemented. In some other embodiments, the adhesive layer may be a die attach film (DAF).

Figure 4:
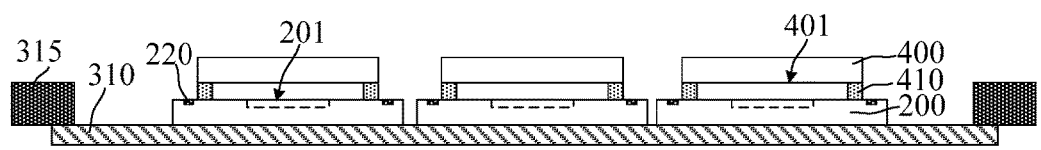

Further, returning to FIG. 20, after the mounting process, the surface of the photosensitive chip that faces away from the optical-signal receiving surface may be attached to an ultraviolet (UV) film, and a first de-bonding process may then be performed to remove the third carrier substrate (S403). FIG. 4 illustrates a schematic cross-sectional view of a structure consistent with various embodiments of the present disclosure.

Referring to FIG. 4, after the mounting process, the surface of the photosensitive chip 200 that faces away from the optical-signal receiving surface 201 may be attached to an UV film 310. After the attaching step, a first de-bonding process may be performed to remove the third carrier substrate 340 (referring to FIG. 1).

The attaching step may be performed to prepare the process for temporarily bonding the photosensitive unit 250 to another carrier substrate. In addition, the UV film 310 may be used to support and fix the photosensitive unit 250 after removing the third carrier substrate 340. The UV film 310 may have degraded adhesive ability under the irradiation of UV light, in a subsequent process, the photosensitive unit 250 may be easily peeled off from the UV film 130.

For example, the UV film 310 may be attached to the surface of the photosensitive chip 200 that faces away from the optical-signal receiving surface 201 using a film coater. The UV film 310 may also be attached to the bottom surface of a frame 315 that has a diameter larger than that of the dimension of photosensitive chip 200. Through the frame 315, the UV film 310 may be stretched, such that the photosensitive unit 250 may be individually fixed to the UV film 310. The UV film 310 and the frame 315 may be consistent with the same or similar parts in the existing technology, and the details will not be described herein again.

In one embodiment, the first temporary bonding layer 345 (referring to FIG. 1) may be a foamed film. Therefore, the first de-bonding process may be a thermal de-bonding process. For example, the first temporary bonding layer 345 may be heated, such that the foamed surface of the foamed film may lose adhesive ability. As such, the third carrier substrate 340 may be removed. Further, the first temporary bonding layer 345 may be subsequently removed by tearing.

Figure 5:
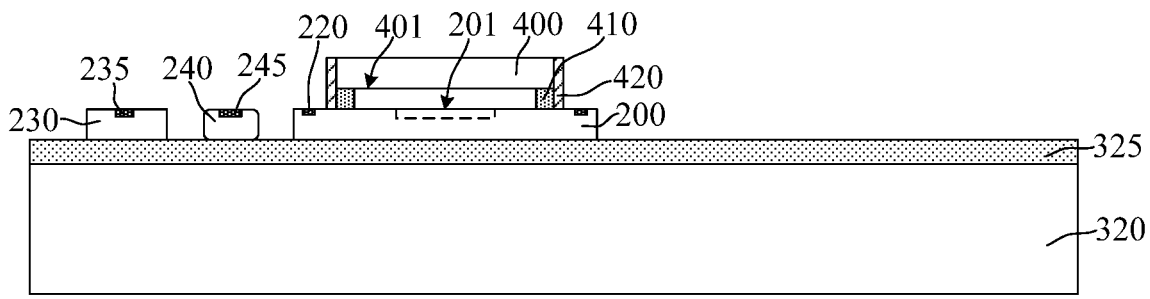

Further, returning to FIG. 20, a first carrier substrate may be provided, a plurality of functional components (not labeled) and the photosensitive chip may be temporarily bonded to the first carrier substrate, and the plurality of functional components may have a plurality of soldering pads, and the soldering pads of the photosensitive chip and the functional components may all face away from the first carrier substrate (S404). FIG. 5 illustrates a schematic cross-sectional view of a structure consistent with various embodiments of the present disclosure.

Referring to FIG. 5, a first carrier substrate 320 may be provided. A plurality of functional components (not labeled) and the photosensitive chip 200 may be temporarily bonded to the first carrier substrate 320. The plurality of functional components may have a plurality of soldering pads, and the soldering pads of the photosensitive chip 200 and the functional components may all face away from the first carrier substrate 320.

In one embodiment, the plurality of functional components may be temporarily bonded to the first carrier substrate 320, thereby preparing the process for subsequent package integration and electrical integration of the plurality of functional components and the photosensitive chip 200.

Moreover, through temporary bonding, it may also be convenient to separate the photosensitive chip 200 and the plurality of functional components from the first carrier substrate 320 in a subsequent process. In addition, the first carrier substrate 320 may also be used to provide a process platform for subsequent formation of an encapsulation layer.

In one embodiment, the first carrier substrate 320 may be a carrier wafer. In other embodiments, the first carrier substrate may be any other appropriate type of substrate.

For example, the plurality of functional components and the photosensitive chip 200 may be bonded to the first carrier substrate 320 through a second temporary bonding layer 325. In one embodiment, the second temporary bonding layer 325 may be a foamed film. For the details of the second temporary bonding layer 325, reference may be made to the corresponding description of the first temporary bonding layer 345 provided above, and the details will not be described herein again.

In one embodiment, after the photosensitive chip 200 is temporarily bonded to the first carrier substrate 320, the plurality of first chip soldering pads 220 of the photosensitive chip 200 may face away from the first carrier substrate 320.

In one embodiment, by using UV light to irradiate the UV film 310 (referring to FIG. 4) at the position of a single photosensitive unit 250 (referring to FIG. 1), the UV film 310 irradiated by the UV light may lose adhesive ability. An ejector pin may be used to individually lift each photosensitive unit 250, and then a vacuum device may be used to pull out the photosensitive unit 250. As such, the plurality of photosensitive units 250 may be sequentially peeled off from the UV film 310 and then placed on the first carrier substrate 320. In one embodiment, sequentially disposing the plurality of photosensitive units 250 to the first carrier substrate 320 may be conducive to improving the position accuracy of the photosensitive units 250 on the first carrier substrate 320, such that the subsequent process can be performed normally.

In one embodiment, after mounting the filter 400 on the photosensitive chip 200, the photosensitive chip 200 may be temporarily bonded on a first carrier substrate 320. In other embodiments, the photosensitive chip may be temporarily bonded to a first carrier substrate, and the filter may then be mounted on the photosensitive chip.

In one embodiment, only one photosensitive unit 250 is described as an example for illustration. In other embodiments, when the disclosed lens module is applied to products with dual cameras or with an array of cameras, the number of the photosensitive units may be multiple according to the actual needs.

The plurality of functional components may be components in the camera assembly that have certain functions and are different from the photosensitive chip 200. The functional components may include at least one of a peripheral chip 230 and a passive component 240.

In one embodiment, the plurality of functional components may include a plurality of peripheral chips 230 and a plurality of passive components 240.

The peripheral chip 230 may be an active component, and after being electrically connected to the photosensitive chip 200 in a subsequent process, the peripheral chip 230 may be able to provide peripheral circuits to the photosensitive chip 200. For example, the peripheral chip 230 may be an analog power supply circuit and digital power supply circuit, a voltage buffer circuit, a shutter circuit, a shutter drive circuit, etc.

In one embodiment, the peripheral chip 230 may include one or both of a DSP and a memory. In other embodiments, the peripheral chip may include chips in other functional types. For illustrative purposes, only one peripheral chip 230 is illustrated in FIG. 5, but the number of the peripheral chips 230 may not be limited to one.

The peripheral chip 230 is usually a silicon-based chip, and thus may be fabricated by an IC fabrication technique. The peripheral chip 230 may also include a plurality of soldering pads for realizing electrical connection between the peripheral chip 230 and other chips and/or components. In one embodiment, the peripheral chip 230 may have a plurality of second chip soldering pads 235.

In one embodiment, the plurality of first chip soldering pads 220 may face away from the first carrier substrate 320, thereby reducing the difficulty of the subsequent electrical connection process. After the peripheral chip 230 is temporarily bonded to the first carrier substrate 320, the plurality of second chip soldering pads 235 may also face away from the first carrier substrate 320, such that the plurality of second chip soldering pads 235 and the plurality of first chip soldering pads 220 may be on the same side with respect to the photosensitive chip 200.

The passive component 240 may be used to play a certain role for the photo-sensing operation of the photosensitive chip 200. The passive component 240 may be a small electronic component such as a resistor, a capacitor, an inductor, a diode, a transistor, a potentiometer, a relay, a driver, etc. For illustrative purposes, only one passive component 240 is illustrated in FIG. 5, but the number of the passive components 240 may not be limited to one.

The passive component 240 may also include a plurality of soldering pads for realizing electrical connection between the passive component 240 and other chips and/or components. In one embodiment, the soldering pads of the passive component 240 may be a plurality of electrodes 245.

In one embodiment, when the plurality of first chip soldering pads 220 face away from the first carrier substrate 320, the difficulty of the subsequent electrical connection process may be reduce. Therefore, after the passive component 240 is temporarily bonded to the first carrier substrate 320, the plurality of electrodes 245 may also face away from the first carrier substrate 320.

It should be noted that in order to reduce the difficulty of the subsequent electrical connection process, the functional components and the photosensitive chip 200 may have a same thickness or may have a limited difference in thickness. For example, according to the thickness of the photosensitive chip 200, the functional components may be formed with a matching thickness. In one embodiment, the thickness difference between the functional components and the photosensitive chip 200 may be in a range of approximately −2 μm to 2 μm.

Correspondingly, the thickness difference between the peripheral chip 230 and the photosensitive chip 200 may be in a range of approximately −2 μm to 2 μm, and the thickness difference between the passive component 240 and the photosensitive chip 200 may be in a range of approximately −2 μm to 2 μm.

Figure 6:
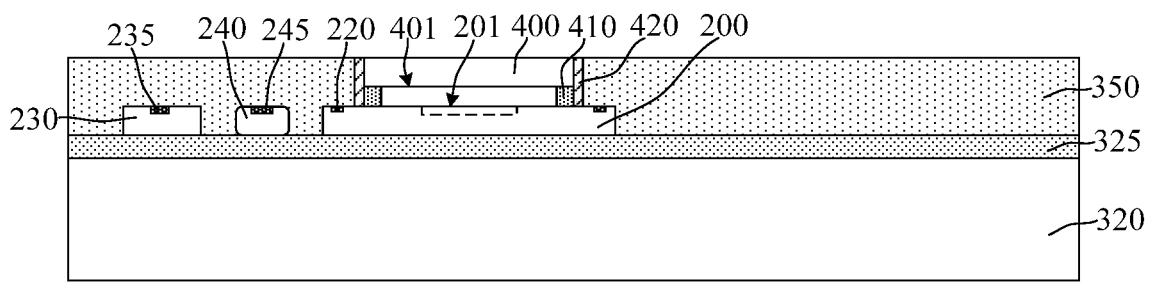

Further, returning to FIG. 20, an encapsulation layer may be formed to cover the first carrier substrate, the photosensitive chip, and the functional components, the encapsulation layer exposing the filter (S405). FIG. 6 illustrates a schematic cross-sectional view of a structure consistent with various embodiments of the present disclosure.

Referring to FIG. 6, an encapsulation layer 350 may be formed to cover the first carrier substrate 320, the photosensitive chip 200, and the plurality of functional components (not labeled). The encapsulation layer 350 may expose the filter 400.

The encapsulation layer 350 may be able to fix the photosensitive chip 200 and the plurality of functional components (such as the peripheral chip 230 and the passive component 240), thereby realizing the package integration of the photosensitive chip 200 and the plurality of functional components.

In one embodiment, through the encapsulation layer 350, the space occupied by the holder in the lens assembly may be reduced, and the circuit board (such as printed circuit board: PCB) may be omitted, such that the total thickness of the lens module may be reduced, thereby meeting the requirements for miniaturization and thinning of the lens module. Moreover, compared to the method in which the peripheral chip is mounted on a peripheral main board, by integrating the photosensitive chip 200 and the plurality of functional components into the encapsulation layer 350, the disclosed method may be able to reduce the distance between the photosensitive chip 200 and the plurality of functional components, and thus may be conducive to reducing the length of the electrical connection between the photosensitive chip and each functional component. As such, the signal transmission speed may be improved, which in turn may improve the performance of the lens module (for example, the shooting speed and the saving speed may be improved).

In one embodiment, the encapsulation layer 350 may function as insulation, sealing, and moisture proof, and may also be conducive to improving the reliability of the lens module.

In one embodiment, the encapsulation layer 350 may be made of an epoxy resin. Epoxy resin has been widely used as an encapsulant for packaging electronic devices and ICs due to a number of advantages that the material demonstrates, including low contraction ratio, high adhesion, strong resistant to corrosion, desired electrical performance, low cost, etc.

In one embodiment, the encapsulation layer 350 may be formed through an injection molding process. Using the injection molding process may be conducive to improving the productivity and reducing the process cost. In addition, by preparing a matching mold, the thickness and the formation region of the encapsulation layer 350 can be made to meet the process requirements, and thus ensure that the encapsulation layer 350 does not cover the filter. As such, the process may be relatively simple.

In one embodiment, the encapsulation layer 350 may be formed through a process including the following exemplary steps. The plurality of functional components (not labeled) and the photosensitive chip 200 may be temporarily bonded to the first carrier substrate 320, and after mounting the filter 400 on the photosensitive chip 200, the first carrier substrate 320 may be placed into a mold. The mold may include an upper mold and a lower mold. The first carrier substrate 320 may be placed between the upper mold and the low mold. After the mold is closed (i.e., the upper mold and the lower mold are brought to tightly contact each other), the mold may be pressed onto the first carrier substrate 320 and the filter 400, and a cavity may thus be formed between the upper mold and the lower mold. A molding material may then be injected into the cavity to form the encapsulation layer 350. Further, the mold may be removed.

In other embodiments, the encapsulation layer may be formed through any other appropriate molding process. For example, after forming an encapsulation layer that covers the filter, an etching process or a grinding process may be performed on the encapsulation layer to remove the portion of the encapsulation layer formed above the filter. As such, the remaining portion of the encapsulation layer may expose the filter.

In one embodiment, the encapsulation layer 350 may also cover the sidewall of the filter 400, thereby improving the sealing of the cavity in the photosensitive unit 250 (referring to FIG. 1), reducing the probability of water vapor, oxidizing gas, etc. entering the cavity, and ensuring the performance of the photosensitive chip 200.

It should be noted that eliminating the circuit board may be able to reduce the thickness of the lens module, and thus the photosensitive chip 200 and the peripheral chip 230 may not need to be thinned down. Therefore, the mechanical strength and reliability of the photosensitive chip 200 and the peripheral chip 230 may be improved, and correspondingly, the reliability of the lens module may also be improved. In other embodiments, according to actual process needs, the thickness of the photosensitive chip and the peripheral chip may be properly reduced. However, the amount of the thickness that is reduced may be small in order to ensure that the mechanical strength and reliability are not affected.

Moreover, prior to forming the encapsulation layer 350 (referring to FIG. 6), the packaging process may further include forming a stress buffer layer 420 on the sidewall of the filter 400.

The stress buffer layer 420 may be conducive to reducing the stress induced into the filter 400 by the encapsulation layer 350, such that the probability that the filter 400 becomes broken may be reduced, and thus the reliability and the yield of the packaging process may be improved. Correspondingly, the reliability of the lens module may also be improved. For example, when the filter 400 is an IR filter glass or a fully transparent glass, the glass piece may be more likely to be broken under stress. By introducing the stress buffer layer 420, the probability that the filter 400 becomes broken may be significantly reduced.

The stress buffer layer 420 may demonstrate adhesive ability, thus ensuring its bonding to the filter 400. In one embodiment, the stress buffer layer 420 may be made of an epoxy-based adhesive. The epoxy-based adhesive may be an epoxy resin adhesive. The epoxy-based adhesive may have various forms, and by changing the composition, materials with different elastic moduli may be obtained. As such, the stress applied on the filter may be controlled according to the actual needs.

In one embodiment, after the photosensitive unit 250 (referring to FIG. 1) is temporarily bonded on the first carrier substrate 320, the stress buffer layer 420 may be formed, such that the first carrier substrate 320 may be able to provide a process platform for the formation of the stress buffer layer 420.

In other embodiments, the stress buffer layer may be formed before mounting the filter on the photosensitive chip; alternatively, the stress buffer layer may be formed after mounting the filter on the photosensitive chip but before bonding the photosensitive unit to the first carrier board.

In one embodiment, the stress buffer layer 420 may be formed through a dispensing process. Adopting the dispensing process may be able to improve the compatibility between the step of forming the stress buffer layer 420 and the existing packaging process, and thus the process may be simple.

In one embodiment, the stress buffer layer 420 may also cover the sidewall of the bonding structure 410, thereby reducing the stress induced into the filter 400 by the encapsulation layer 350, which may further improve the reliability and the yield of the packaging process.

Further, returning to FIG. 20, a redistribution layer (RDL) structure may be formed on one side of the encapsulation layer close to the filter to electrically connect to the plurality of soldering pads of the photosensitive chip and the plurality of soldering pads of the plurality of functional components (S406). FIGS. 7-11 illustrate schematic cross-sectional views of a structure consistent with various embodiments of the present disclosure.

Referring to FIG. 7-11, a RDL structure 360 (referring to FIG. 11) may be formed on one side of the encapsulation layer 350 close to the filter 400 to electrically connect to the soldering pads of the photosensitive chip 200 and the soldering pads of the functional components (not labeled).

The RDL structure 360 may be used to realize the electrical integration of the formed camera assembly.

In one embodiment, by forming the encapsulation layer 350 and the RDL structure 360, the distance between the photosensitive chip and the functional component may be reduced, and thus the length of the electrical connection between the photosensitive chip 200 and the functional component may also be reduced. As such, the signal transmission speed may be improved, and the performance of the lens module may also be improved. For example, the peripheral chip 230 may include at least one of a DSP and a memory, and thus may be conducive to improving the shooting speed and the saving speed.

In addition, by forming the RDL structure 360, the feasibility of the electrical connection process may be improved while reducing the distance between the photosensitive chip 200 and the functional components. Moreover, compared with a wire bonding process, the formation of the RDL structure 360 may be able to realize mass production, and thus improve the packaging efficiency.

In one embodiment, the RDL structure 360 may be formed through a process including the following steps.

Figure 7:
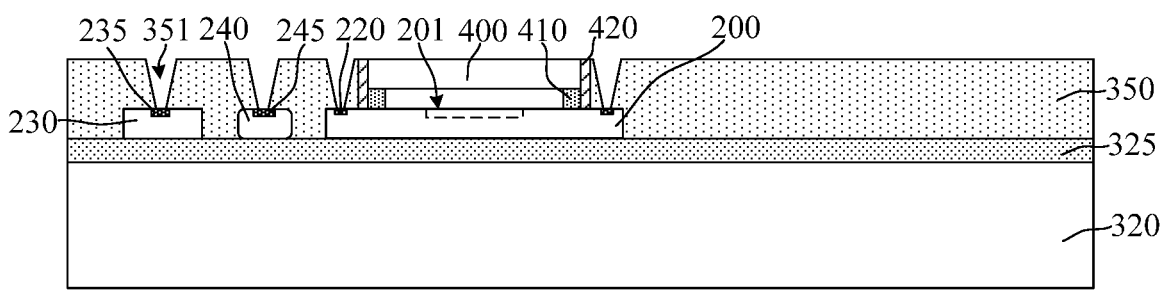

Referring to FIG. 7, a plurality of conductive vias 351 may be formed in the encapsulation layer 350, and a soldering pad (not labeled) may be exposed by the conductive via 351.

In one embodiment, the plurality of conductive vias 351 may be able to expose the first chip soldering pads 220, the second chip soldering pads 135, the electrodes 245, respectively, thereby preparing for subsequent electrical connection process.

In one embodiment, after forming the encapsulation layer 350, the encapsulation layer 350 may be etched through a laser etching process to form a conductive via 351 in the encapsulation layer 350. The process accuracy of the laser etching process may be high, and thus the fabrication position and the dimension of the conductive via 351 can be accurately determined.

In one embodiment, the thickness difference between the plurality of functional components and the photosensitive chip 200 may be in a range of approximately −2 μm to 2 μm. The depth of the plurality of conductive vias 351 may be the same or similar, such that the process difficulty of the laser etch process may be reduced accordingly.

In other embodiments, the conductive via may be formed during the step of forming the encapsulation layer. For example, by customizing the mold used in the injection molding process, one of the upper mold and the lower mold may have a plurality of protruding bosses. After the mold is closed, the mold may be pressed onto the first carrier substrate and the filter, and each protruding boss may be pressed onto the corresponding soldering pad. Therefore, a cavity may be formed between the upper mold and lower mold, and the plurality of protruding bosses may be used to occupy positions for the plurality of conductive vias. Correspondingly, after removing the mold, the plurality of conductive vias may then be formed in the encapsulation layer.

Figure 8:
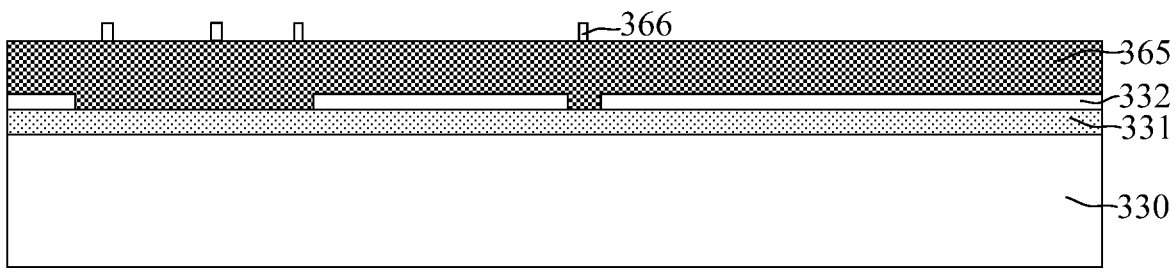
Figure 9:
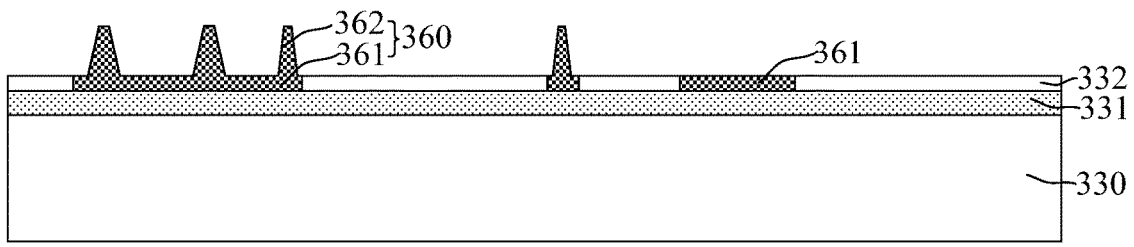

Further, referring to FIGS. 8-9, a second carrier substrate 330 may be provided. An RDL structure 360 (referring to FIG. 9) may be formed on the second carrier substrate 330. The RDL structure 360 may include an interconnection line 361 (referring to FIG. 9) and a plurality of conductive plugs 362 (referring to FIG. 9) protruding from the interconnection line 361.

Forming the RDL structure 360 on the second carrier substrate 330 may be able to prevent the formation process for the RDL structure 360 from generating contamination on the filter 400.

In one embodiment, the RDL structure 360 may be formed by a process including the following exemplary steps. A dielectric layer 332 may be formed on the second carrier substrate 330. The dielectric layer 332 may be patterned such that an interconnection trench (not shown) may be formed in the dielectric layer 332. A conductive material 365 (referring to FIG. 8) may be filled into the interconnection trench. The conductive material 365 may also cover the top surface of the dielectric layer 332. A patterned mask layer 366 (referring to FIG. 8) may be formed on the conductive material 365. The patterned mask layer 366 may cover a portion of the conductive material 365 corresponding to the positions of the plurality conductive plugs 362. Further, using the patterned mask layer 366 as an etch mask, the conductive material 365 may then be etched to expose the dielectric layer 332. As such, the interconnection line 361 located in the interconnection trench and the plurality of conductive plugs 362 protruding from the interconnection line 361 may be formed. The patterned mask layer 366 and the dielectric layer 332 may then be removed.

The interconnection trench may be used to define the shape, position, and dimension of the interconnection line 361. The dielectric layer 332 may be made of a photosensitive material, and thus can be patterned through a photolithography process. As such, the process difficulty for forming the interconnection trench may be reduced. In one embodiment, the dielectric layer 332 may be made of photosensitive polyimide. In other embodiments, the dielectric layer 332 may be made of photosensitive benzocyclobutene or photosensitive polybenzoxazole.

In one embodiment, the conductive material 365 may be cupper, that is, the RDL structure 360 may be made of cupper. Using cupper form forming the RDL structure 360 may be conducive to improving the electrical connection performance of the RDL structure 360. In addition, the resistivity of cupper is relatively low, which may also be conducive to improve the conductivity of the RDL structure 360. Moreover, cupper demonstrates desired filling properties, and thus may improve the filling effect of the conductive material 365 in the interconnection trench. In other embodiments, the RDL structure 360 may also be any other appropriate conductive material.

The patterned mask layer 366 may be used as the etch mask when etching the conductive material 365. In one embodiment, the patterned mask layer 366 may be made of a photoresist material. Therefore, after forming the RDL structure 360, the patterned mask layer 366 may be removed by an ashing or wet stripping method. In other embodiments, the patterned mask layer may be made of any other appropriate material that can be etched, and the patterned mask layer may have a single-layer or multi-layer structure.

The dielectric layer 332 made of the material described above may demonstrate strong corrosion resistance. Therefore, after forming the RDL structure 360, a reactive ion etching (RIE) process may be performed to remove the dielectric layer 332, such that the interconnection line 361 may be exposed on the second carrier substrate 330, thereby preparing for the subsequent electrical connection process.

In one embodiment, prior to forming the dielectric layer 332 on the second carrier substrate 330, the packaging method may further include forming a third temporary bonding layer 331 on the second carrier substrate 330. Correspondingly, the dielectric layer 332 may be formed on the third temporary bonding layer 331.

The third temporary bonding layer 331 may act as a peel layer to facilitate subsequent separation of the RDL structure 360 and the second carrier substrate 330. In one embodiment, the third temporary bonding layer 331 may be a foamed layer. For a detailed description of the third temporary bonding layer 331, reference may be made to the corresponding description of the first temporary bonding layer 345 (referring to FIG. 1) provided above, and the details will not be described herein again.

It should be noted that, in other embodiments, prior to forming the third temporary bonding layer on the second carrier substrate, the packaging process may further include forming a passivation layer on the second carrier substrate. The formation of the passivation layer may be able to prevent the second carrier substrate from being contaminated, and thus the second carrier substrate can be reused. The passivation layer may be made of silicon oxide or silicon nitride.

Figure 10:
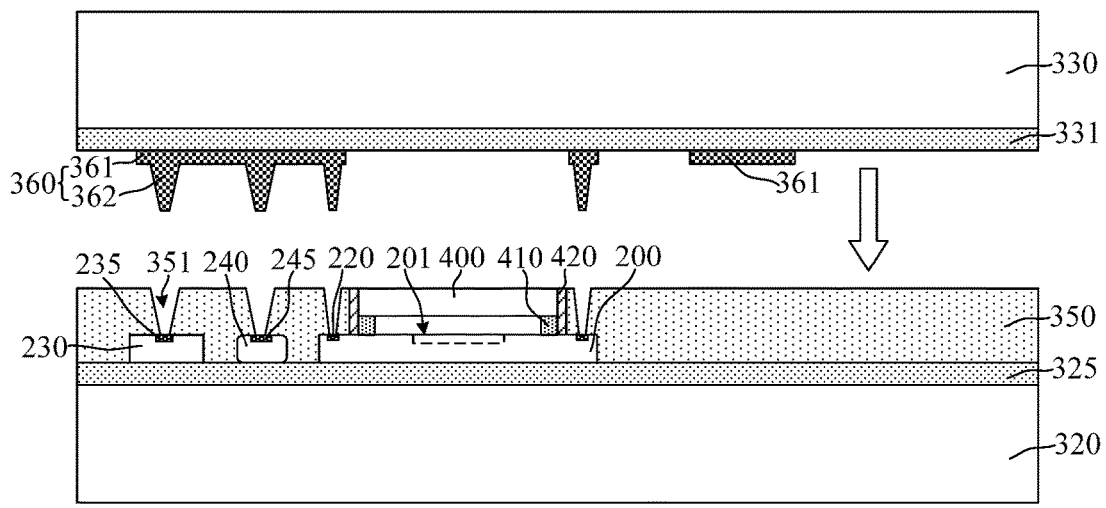
Figure 11:
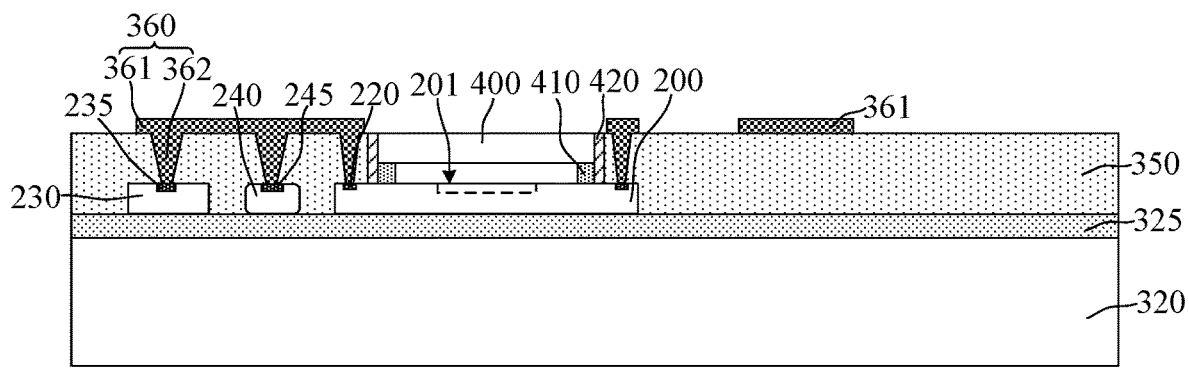

Further, referring to FIGS. 10-11, each conductive plug 362 may be bonded into a corresponding conductive via 351 (referring to FIG. 10), and thus may be electrically connected to a corresponding soldering pad.

Each conductive via 351 may expose a first chip soldering pad 220, a second chip soldering pad 235, or an electrode 245. Therefore, after a conductive plug 362 is bonded into the conductive via 352, the conductive plug 362 may be electrically connected to the first chip soldering pad 220, the second chip soldering pad 235, or the electrode 245.

In one embodiment, the RDL structure 360 may be arranged to face the filter 400, and then through a metal bonding process, the plurality of conductive plugs 362 may be correspondingly bonded into the plurality of conductive vias 351.

In one embodiment, the metal bonding process may be a thermal bonding process. During the metal bonding process, the plurality of conductive plugs 362 and the corresponding first chip soldering pads 220, the second chip soldering pads 235, and the electrodes 245 may undergo plastic deformation at the interfaces, making the atoms at the interfaces to contact each other. As the bonding temperature increases, the lattices at the interfaces may be reorganized, thereby achieving the bonding effect. The bonding strength, the electrical and thermal conductivity, the electromigration resistance, and the mechanical connection performance achieved through the thermal bonding process may be desired.

It should be noted that as the bonding temperature increases, the atoms at the interfaces may gain more energy, and thus interatomic diffusion may be more active. In addition, the increase of the bonding temperature may also promote the growth of grains, and the energy-gained grains may be able to grow across the interface, which may be conducive to eliminating the interface. As such, the materials at the interface may be fused into a single piece. However, the bonding temperature of the metal bonding process may not be too high. An excessively high bonding temperature may have undesired effect on the performance of the photosensitive chip 200 and the peripheral chip 230. In particular, for those delicate components formed in the camera assembly, the excessively high process temperature may also generate thermal stress, causing problems such as decreased alignment accuracy, increased process cost, reduced production efficiency, etc. Therefore, in one embodiment, the metal bonding process may be a metal low-temperature bonding process, and the bonding temperature of the metal bonding process may be smaller than or equal to 250° C. The lowest bonding temperature may be any appropriate temperature that is sufficient enough for achieving the bonding.

At the set bonding temperature, the interdiffusion of atoms may be easier by increasing the pressure. As such, the quality of the bonding between the RDL structure 360 and the soldering pads may be improved. Therefore, in one embodiment, the pressure adopted in the metal bonding process may be larger than or equal to 200 kPa. The pressure may be generated by any appropriate pressing tool.

In one embodiment, increasing the bonding time may also be able to improve the bonding quality. In one embodiment, the bonding time of the metal bonding process may be larger than or equal to 30 minutes.

It should be noted that during an actual process, the bonding temperature, the pressure, and the bonding time may be properly adjusted to match with each other, and thus ensure the quality and efficiency of the metal bonding. It should also be noted that in order to reduce the probability of oxidation or contamination of the interfaces, the metal bonding process can be performed in a vacuum environment.

In one embodiment, after bonding the plurality of conductive plugs 362 correspondingly into the plurality of conductive vias 351 (referring to FIG. 9), the packaging method may also include performing a second de-bonding process to remove the second carrier substrate 330 (referring to FIG. 10) and the third temporary bonding layer 331 (referring to FIG. 10).

By removing the second carrier substrate 330 and the third temporary bonding layer 331, the interconnection line 361 may be exposed, thereby preparing for the subsequent electrical connection process. For a detailed description of the second de-bonding process, reference may be made to corresponding description of the first de-bonding process provide above, and the details will not be described herein again.

Figure 12:
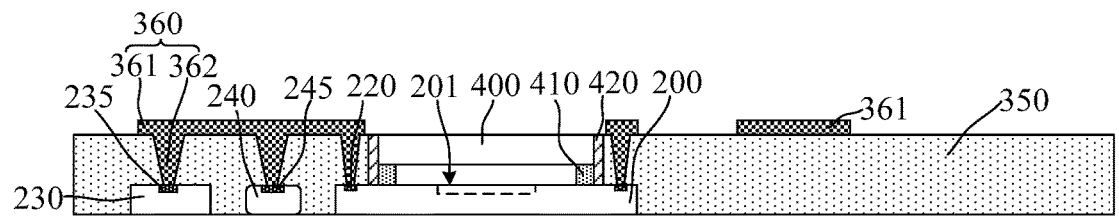

Further, returning to FIG. 20, a third de-bonding process may be performed to remove the first carrier substrate (S407). FIG. 12 illustrates a schematic cross-sectional view of a structure consistent with various embodiments of the present disclosure.

Referring to FIG. 12, a third de-bonding process may be performed to remove the first carrier substrate 320 (referring to FIG. 11). In one embodiment, the first carrier substrate 320 may be used to provide a process platform for the formation of the encapsulation layer 350. Therefore, after forming the encapsulation layer 350, the first carrier substrate 320 may be removed.

In one embodiment, the first carrier substrate 320 may be removed after forming the RDL structure 360 to electrically connect to the plurality of solder pads. As such, the first carrier substrate 320 may be able to provide a process platform for the electrical connection process, and thus the operability and stability of the process may be improved. In other embodiments, the first carrier substrate may be removed after forming the encapsulation layer but before performing the metal bonding process.

In one embodiment, the third de-bonding process may be a thermal de-bonding process, and during the third de-bonding process, the first carrier substrate 320 and the second temporary bonding layer 325 (referring to FIG. 1) may be sequentially removed. For a detailed description of the third de-bonding process, reference may be made to corresponding description of the first de-bonding process provide above, and the details will not be described herein again.

Figure 13:
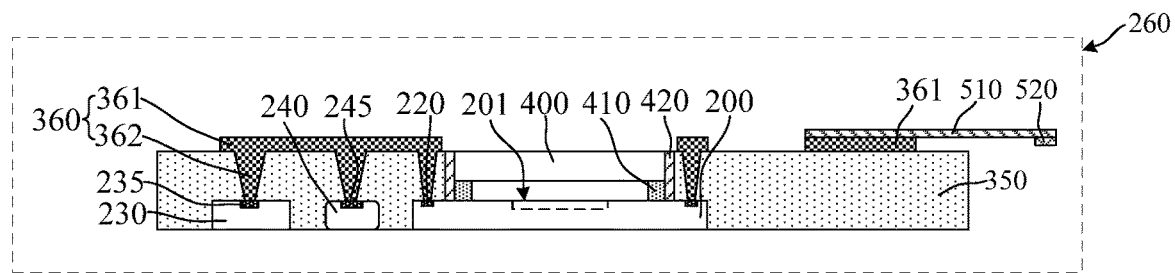

Further, returning to FIG. 20, after removing the first carrier substrate, the packaging process may also include performing a dicing process on the encapsulation layer to form a plurality of individual camera assemblies (S408). FIG. 13 illustrates a schematic cross-sectional view of a structure consistent with various embodiments of the present disclosure.

Referring to FIG. 13, after removing the first carrier substrate 320 (referring to FIG. 10), a dicing process may be performed on the encapsulation layer 350. Through the dicing process, a plurality of individual camera assemblies 260, each having a dimension meeting the process requirements, may be formed, thereby preparing for the subsequent installation of lens assemblies. In one embodiment, the dicing process may be a laser cutting process.

In one embodiment, in order to reduce the probability of the damage of the first carrier substrate 320, after performing the third de-bonding process, the dicing process may then be performed. In other embodiments, the dicing process may be performed before performing the third de-bonding process.

Referring to FIG. 13, it should be noted that after forming the RDL structure 360 to electrically connect to the plurality of soldering pads, the packaging method may also include bonding a flexible printed circuit (FPC) board 510 to the RDL structure 360.

The FPC board 510 may be used, in a case where the circuit board is eliminated, for realizing the electrical connection between the camera assembly 260 and the subsequently-installed lens assembly and between the formed lens module and other components. After forming the lens module in a subsequent process, the lens module may be able to electrically connect to other components in the electronic device through the FPC board 510, and thus the normal shooting function of the electronic device may be implemented.

In one embodiment, the FPC board 510 may have a circuit structure. Therefore, through a metal bonding process, the FPC board 510 may be bonded to the RDL structure 360 to realize electrical connection.

In one embodiment, in order to improve the process feasibility, after performing the third de-bonding process and the dicing process, the FPC board 510 may be bonded to the RDL structure 360.

It should be noted that a plurality of connectors 520 formed on the FPC board 510 may be used to electrically connect the FPC board 510 to other circuit components. When the lens module is applied to an electronic device, the plurality of connectors 520 may be electrically connected to the main board of the electronic device, thereby implementing information transmission between the lens module and the other components of the electronic device, e.g. transmitting image information of the lens module to the electronic device. In one embodiment, the plurality of connectors 520 may be contact connectors.

FIGS. 14-17 illustrate schematic views of structures at certain stages of another exemplary method for packaging a camera assembly according to various embodiments of the present disclosure.

For the method illustrated in FIGS. 14-17, the aspects that are the same or similar to the embodiments described above will not be described herein again. However, in the following aspects, the method illustrated in FIGS. 14-17 may be different from that described above: in the interconnection structure 360a (referring to FIG. 15), the interconnection line 361a and the plurality of conductive plugs 362a may be formed in different steps.

Figure 14:
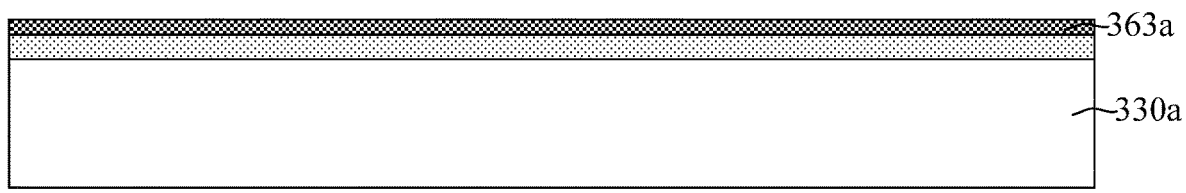
FIGS. 14-17 illustrate schematic views of structures at certain stages of another exemplary method for packaging a camera assembly according to various embodiments of the present disclosure.
Figure 15:
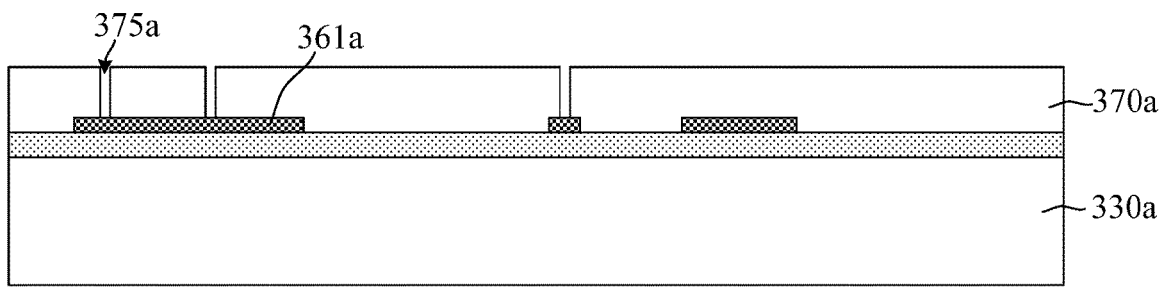

For example, referring to FIGS. 14-15, a conductive layer 363a (referring to FIG. 14) on the second carrier substrate 330a. The conductive layer 363a may then be etched to form an interconnection line 361a (referring to FIG. 15).

In one embodiment, the interconnection line 361a may be made of aluminum. In other embodiments, the interconnection line may be made of any other conductive material that can be easily patterned through an etching process.

In one embodiment, a patterned mask layer (for example, a patterned photoresist layer) may be formed on the conductive layer, and then a dry etching process may be performed to etch the portion of the conductive layer that is exposed by the patterned mask layer. As such, the interconnection line 361a may be formed.

Further, referring to FIG. 15, a sacrificial layer 370a may be formed to cover the second carrier substrate 330a and the interconnection line 361a. The sacrificial layer 370a may be patterned to form a plurality of vias 375a. The plurality of vias 375a may be used to define the position of subsequently formed conductive plugs.

In one embodiment, the sacrificial layer 370a may be made of a photosensitive material, and thus can be patterned through a photolithography process. As such, the process difficulty for forming the vias 375a may be reduced.

In one embodiment, the sacrificial layer 370a may be made of photosensitive polyimide. In other embodiments, the sacrificial layer 370a may be made of photosensitive benzocyclobutene or photosensitive polybenzoxazole.

Figure 16:
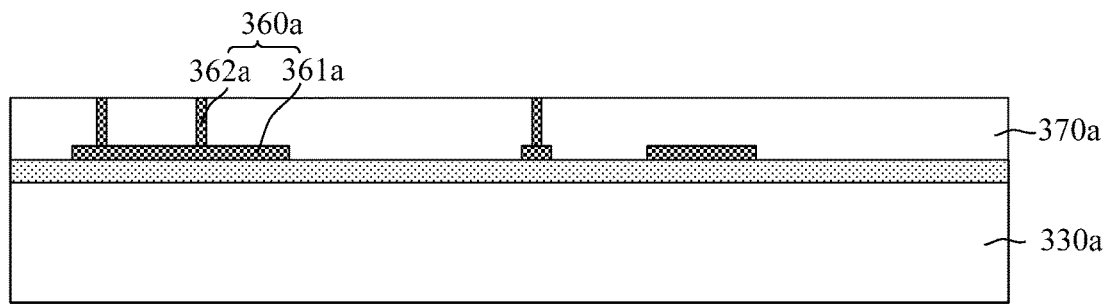

Further, referring to FIG. 16, a plurality of conductive plugs 362a may be formed in the plurality of vias 375a (referring to FIG. 15). In one embodiment, a conductive material may be filled into the plurality of vias 375 through an electroplating process to form the plurality of conductive plugs 362a. The plurality of conductive plugs 362a and the interconnection line 361a may together form an RDL structure 360a.

The plurality of conductive plugs 362a and the interconnection line 361a may or may not be made of a same material. In one embodiment, in order to improve the conductivity of the conductive plugs 362a and also improve the filling performance of the conductive material in the plurality of vias 375a, the plurality of conductive plugs 362 may be made of cupper.

Figure 17:
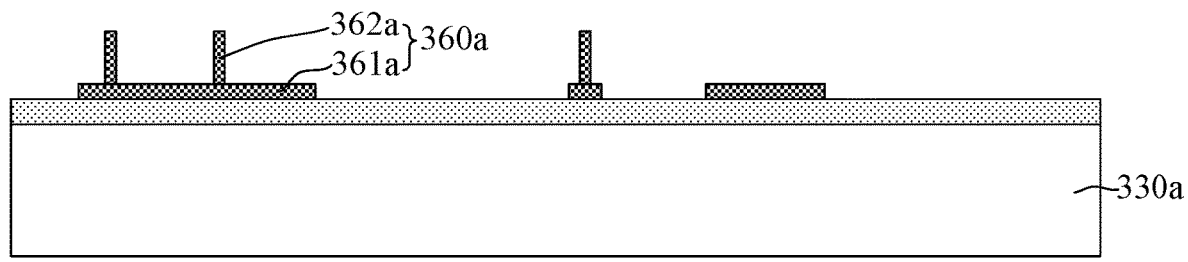

Further, referring to FIG. 17, the sacrificial layer 370a (referring to FIG. 16) may be removed.

The sacrificial layer 370a made of the materials described above may demonstrate strong corrosion resistance. Therefore, after forming the RDL structure 360a, an RIE process may be performed to remove the sacrificial layer 370a.

For a detailed description of the other aspects of the packaging method, reference can be made to the corresponding description in the embodiments provided above, and the details will not be described herein again.

Correspondingly, the present disclosure also provides a camera assembly. FIG. 13 illustrates a schematic cross-sectional view of an exemplary camera assembly consistent with various embodiments of the present disclosure.

Referring to FIG. 13, the camera assembly 260 may include an encapsulation layer 350 as well as a photosensitive unit 250 (referring to FIG. 1) and a plurality of functional components (not labeled) that are embedded in the encapsulation layer 350. The photosensitive unit 250 may include a photosensitive chip 200 and a filter 400 mounted on the photosensitive chip 200. The photosensitive chip 200 and the plurality of functional components may be exposed at the bottom surface (not labeled) of the encapsulation layer 350. The top surface (not labeled) of the encapsulation layer 350 may be higher than the photosensitive chip 200 and the plurality of functional components, and the filter 400 may be exposed by the top surface of the encapsulation layer 350. The photosensitive chip 200 and the plurality of functional chips may all have a plurality of soldering pads. The plurality of soldering pads may all face away from the bottom surface of the encapsulation layer 350. The camera assembly may also include a redistribution layer (RDL) structure 360, located on one side of the top surface of the encapsulation layer 350. The RDL structure 360 may electrically connected to the plurality of soldering pads.

The encapsulation layer 350 may be able to fix the photosensitive chip 200 and the plurality of functional components, thereby realizing the package integration of the photosensitive chip 200 and the plurality of functional components. Through the formation of the encapsulation layer and the redistribution structure, the circuit board may be omitted, such that the total thickness of the lens module may be reduced, thereby meeting the requirements for miniaturization and thinning of the lens module.

In one embodiment, the encapsulation layer 350 may be made of a molding material. In addition, the encapsulation layer 350 may function as insulation, sealing, and moisture proof, and may also be conducive to improving the reliability of the lens module. For example, the encapsulation layer 350 may be made of an epoxy resin.

In one embodiment, the encapsulation layer 350 may include a top surface and a bottom surface that is opposite to the top surface. The top surface of the encapsulation layer 350 may be a surface used to mount a lens assembly.

In one embodiment, during the packaging process of the camera assembly 260, usually, after the photosensitive chip 200 and the plurality of functional components are temporarily bonded to a carrier substrate, the encapsulation layer 350 may be formed on the carrier substrate, and thus the bottom surface of the encapsulation layer 350 may expose the photosensitive chip 200 and the plurality of functional components.

In one embodiment, the top surface of the encapsulation layer 350 may be higher than the photosensitive chip 00 and the plurality of functional components. The encapsulation layer 350 may also cover the sidewall of the filter 400, thereby improving the sealing of the cavity in the photosensitive unit 250, reducing the probability of water vapor, oxidizing gas, etc. entering the cavity, and ensuring the performance of the photosensitive chip 200.

In one embodiment, the photosensitive chip 200 may be a CMOS image transistor chip. In other embodiments, the photosensitive chip 200 may be a CCD image sensor chip.

Referring to FIG. 1, in one embodiment, the photosensitive chip 200 may include a photosensitive region 200C and a peripheral region 200E surrounding the photosensitive region 200C. The photosensitive chip 200 may also have an optical-signal receiving surface 201 located in the photosensitive region 200C.

The photosensitive chip 200 is usually a silicon-based chip. The plurality of soldering pads of the photosensitive chip 200 may be used to realize electrical connection between the photosensitive chip 200 and other chips or components. In one embodiment, the photosensitive chip 200 may have a plurality of first chip soldering pad 220 located in the peripheral region 200E.

The filter 400 may be mounted on the photosensitive chip 200 to prevent the packaging process from causing contamination on the optical-signal receiving surface 201, and also reduce the overall thickness of the lens module 600, thereby meeting the requirements for miniaturization and thinning of the lens module.

In order to implement the normal functions of the lens module, the filter 400 may be an IR filter glass, or a fully transparent glass. In one embodiment, the filter 400 may be an IR filter glass, and may also be used to eliminate the influence of IR in the incident light on the performance of the photosensitive chip 200, which may be conducive to improving the imaging effect.

The filter 400 may be bonded to the photosensitive chip 200 through a bonding structure 410. The bonding structure 410 may surround the optical-signal receiving surface 201 of the photosensitive chip 200. The bonding structure 410 may be used to realize physical connection between the filter 400 and the photosensitive chip 200, and also prevent the filter 400 and the photosensitive chip 200 from directly contacting each other. In one embodiment, the bonding structure 410 may surround the optical-signal receiving surface 201.

In one embodiment, the bonding structure 410 may be made of a dry film. In other embodiments, the bonding structure may be made of polyimide, PBO, or BCB.

It should be noted that in one embodiment, only one photosensitive unit 250 is shown as an example for illustration, and in other embodiments, when the lens module is applied to products with dual cameras or an array of cameras, the number of the photosensitive units may be multiple according to the actual needs.

It should also be noted that because the encapsulation layer 350 covers the sidewall of the filter 400, the camera assembly 260 may also include a stress buffer layer 420 located between the encapsulation layer 350 and the sidewall of the filter 400.

The stress buffer layer 420 may be conducive to reducing the stress induced into the filter 400 by the encapsulation layer 350, such that the probability that the filter 400 becomes broken may be reduced, and thus the reliability of the lens module may be improved. In one embodiment, the stress buffer layer 420 may be a photosensitive buffer.

The stress buffer layer 420 may demonstrate adhesive ability, thus ensuring its bonding to the filter 400. In one embodiment, the stress buffer layer 420 may be made of an epoxy-based adhesive.

In one embodiment, the stress buffer layer 420 may also cover the sidewall of the bonding structure 410, thereby reducing the stress induced into the filter 400 by the encapsulation layer 350, which may further improve the reliability and the yield of the camera assembly 260.

The plurality of functional components may be components in the camera assembly that have certain functions and are different from the photosensitive chip 200. The functional components may include at least one of a peripheral chip 230 and a passive component 240.

In one embodiment, the plurality of functional components may include a plurality of peripheral chips 230 and a plurality of passive components 240.

The peripheral chip 230 may be an active component for providing peripheral circuits to the photosensitive chip 200. For example, the peripheral chip 230 may be an analog power supply circuit and digital power supply circuit, a voltage buffer circuit, a shutter circuit, a shutter drive circuit, etc.

In one embodiment, the peripheral chip 230 may include one or both of a DSP and a memory. In other embodiments, the peripheral chip may include chips in other functional types. For illustrative purposes, only one peripheral chip 230 is illustrated in FIG. 13, but the number of the peripheral chips 230 may not be limited to one.

The peripheral chip 230 is usually a silicon-based chip. The plurality of soldering pads of the peripheral chip 230 may be used for realizing electrical connection between the peripheral chip 230 and other chips and/or components. In one embodiment, the peripheral chip 230 may have a plurality of second chip soldering pads 235.

In one embodiment, the plurality of second chip soldering pads 235 may face the filter 400. Therefore, the plurality of second chip soldering pads 235 and the plurality of first chip soldering pads 220 may be on the same side with respect to the photosensitive chip 200, thereby facilitating electrical connection between the peripheral chip 230 and the photosensitive chip 200. Correspondingly, the plurality of second chip soldering pads 235 may face away from the bottom surface of the encapsulation layer 350.

The plurality of passive components 240 may be used to play a certain role for the photo-sensing operation of the photosensitive chip 200. The passive component 240 may be a small electronic component such as a resistor, a capacitor, an inductor, a diode, a transistor, a potentiometer, a relay, a driver, etc. For illustrative purposes, only one passive component 240 is illustrated in FIG. 13, but the number of the passive components 240 may not be limited to one.

The plurality of soldering pads of the passive component 240 may be used for realizing electrical connection between the passive component 240 and other chips and/or components. In one embodiment, the soldering pads of the passive component 240 may be a plurality of electrodes 245.

In one embodiment, when the plurality of first chip soldering pads 220 face the filter 400, the plurality of electrodes 245 facing the filter 400 may facilitate electrical connection between the plurality of passive components 240 and the photosensitive chip 200. Correspondingly, the plurality of electrodes 245 may also face away from the bottom surface of the encapsulation layer 350.

It should be noted that because the photosensitive chip 200 and the plurality of functional components all face away from the bottom surface of the encapsulation layer 350, in order to reduce the difficulty of the subsequent electrical connection process, the functional components and the photosensitive chip 200 may have a same thickness or may have a limited difference in thickness. For example, the thickness of the functional components may be adjusted according to the thickness of the photosensitive chip 200. In one embodiment, the thickness difference between the functional components and the photosensitive chip 200 may be in a range of approximately −2 μm to 2 μm.

It should be also noted that eliminating the circuit board may be able to reduce the thickness of the lens module, and thus the photosensitive chip 200 and the peripheral chip 230 may not need to be thinned down during the packaging process of the camera assembly 260. Compared to the photosensitive chip and the peripheral chip in existing lens modules, the photosensitive chip and the peripheral chip according to the present disclosure may have a larger thickness, which may improve the mechanical strength and reliability of the photosensitive chip 200 and the peripheral chip 230, and thus may further improve the reliability of the lens module. In other embodiments, according to the actual process needs, the thickness of the photosensitive chip and the peripheral chip may be thinned down. However, the amount of the thickness that is reduced may be small in order to ensure that the mechanical strength and reliability are not affected.

The RDL structure 360 may be used to realize electrical integration of the lens assembly 260. Through the RDL structure 360 and the encapsulation layer 350, the performance of the lens module may be improved (for example, the shooting speed and the saving speed may be improved). Moreover, through the RDL structure 360, the feasibility and the packaging efficiency of the electrical connection process may be improved.

In one embodiment, the RDL structure 360 may electrically connected to the plurality of first chip soldering pads 220, the plurality of second chip soldering pads 235, and the plurality of electrodes 245.

Because the encapsulation layer 350 covers the plurality of first chip soldering pads 220, the plurality of second chip soldering pads 235, and the plurality of electrodes 245, the RDL structure 360 may include a plurality of conductive plugs 362 and an interconnection line 361. The plurality of conductive plugs 362 may be located in the encapsulation layer 350 and may electrically connected to the plurality of first chip soldering pads 220, the plurality of second chip soldering pads 235, and the plurality of electrodes 245, respectively. The interconnection line 361 may be located on the top surface of the encapsulation layer 350 and may be connected to the plurality of conductive plugs 362.

In one embodiment, the plurality of conductive plugs 362 and the interconnection line 361 may be made of cupper. That is, the RDL structure 360 may be made of cupper. In other embodiments, the RDL structure 360 may be made of any appropriate conductive material.

In one embodiment, the plurality of conductive plugs 362 and the interconnection line 361 may form a single piece, thereby simplifying the process steps for forming the RDL structure 360. In other embodiments, the plurality of conductive plugs and the interconnection line may not have a single-piece structure, and correspondingly, the plurality of conductive plugs and the interconnection line may or may not be made of a same material.

In one embodiment, the camera assembly 260 may also include a FPC board 510 located on the RDL structure 360. The FPC board 510 may be used, in a case where the circuit board is eliminated, for realizing the electrical connection between the camera assembly 260 and the lens assembly and between the formed lens module and other components. The lens module may also be electrically connected to other components in the electronic device through the FPC board 510, and thus the normal shooting function of the electronic device may be implemented.

In one embodiment, the FPC board 510 may have a circuit structure. Therefore, through a metal bonding process, the FPC board 510 may be bonded to the RDL structure 360 to realize electrical connection.

It should be noted that a plurality of connectors 520 may be disposed on the FPC board 510. When the lens module is applied to an electronic device, the plurality of connectors 520 may be electrically connected to the main board of the electronic device, thereby implementing information transmission between the lens module and the other components of the electronic device, e.g. transmitting image information of the lens module to the electronic device. In one embodiment, the plurality of connectors 520 may be contact connectors.

The disclosed camera assembly may be formed by the packaging method according to the embodiments of the present disclosure, or may be formed by any other appropriate packaging method. For a detailed description of the camera assembly, reference may be made to corresponding description in the embodiments provide above, and the details will not be described herein again.

Figure 18:
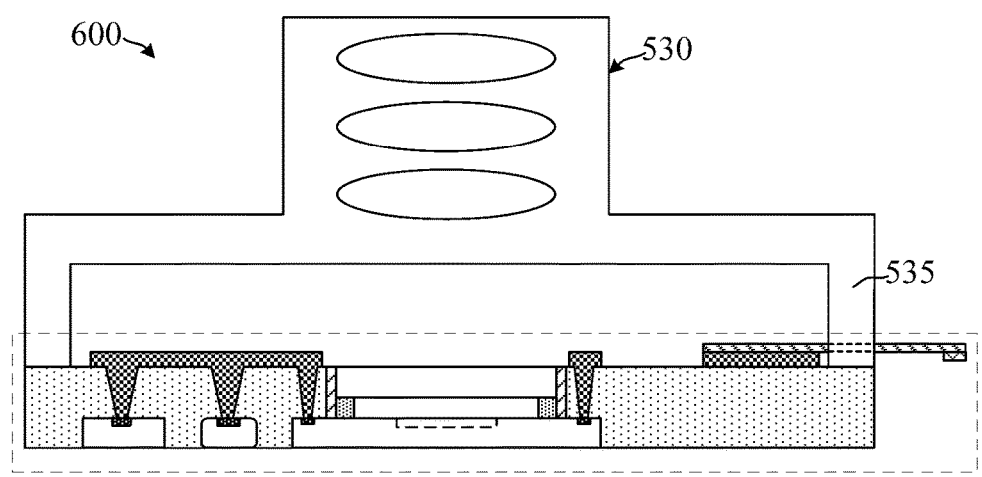
FIG. 18 illustrates a schematic view of an exemplary lens module according to various embodiments of the present disclosure.

Further, the present disclosure also provides a lens module. FIG. 18 illustrates a schematic cross-sectional view of an exemplary lens module according to various embodiments of the present disclosure.

Referring to FIG. 18, the lens module 600 may include a camera assembly (shown in a dashed-line frame in FIG. 18) according to various embodiments of the present disclosure; and a lens assembly 530, including a holder 535. The holder 535 may be mounted on the top surface of the encapsulation layer (not labeled), and may surround the photosensitive chip and a plurality of functional components. The lens assembly 530 may be electrically connected to the photosensitive chip and the plurality of functional components.

The lens assembly 530 may usually include a holder 535, a motor (not shown) installed on the holder, and a lens group (not shown) installed on the motor. Through the holder 535, the installation of the lens assembly 530 may be facilitated, and the lens group may also be placed on the photosensitive path of the photosensitive unit.

In one embodiment, the thickness of the camera assembly is small, and through the encapsulation layer, the thickness of the lens assembly 530 may be reduced. Therefore, the total thickness of the lens module 600 may be reduced.

Moreover, according to the disclosed lens module, the photosensitive unit and the functional components are disposed in the holder 535. Therefore, compared to a lens module in which the functional component (for example, a peripheral chip) is mounted on a peripheral main board, the disclosed lens module 600 reduces the distance between the functional component and the photosensitive chip, and thus reduces the dimension of the lens module 600. In addition, the length of the electrical connection is also reduced, thereby significantly improving the signal transmission speed of the lens module 600. As such, the performance of the lens module 600 may be improved (for example, the shooting speed and the saving speed may be improved).

Further, according to the disclosed lens module, the photosensitive unit and the functional components are all integrated in the encapsulation layer, and the photosensitive unit, the functional components, and the RDL structure are all disposed in the holder 535. Therefore, all of the photosensitive unit, the peripheral chip, the passive components, and the RDL structure may be protected, which may be conducive to improving the reliability and stability of the lens module 600, and may also ensure the imaging quality of the lens module 600.

According to the present disclosure, a FPC board is bonded to the RDL structure, and thus the holder 535 may be partially mounted on the encapsulation layer, and partially mounted on the FPC board. Correspondingly, the motor in the lens assembly 530 is electrically connected to the photosensitive chip and the functional components through the FPC board. As such electrical connection between the lens assembly 530 and the camera assembly may be realized.

For a detailed description of the camera assembly, reference may be made to the corresponding description in the embodiments provide above, and the details will not be described herein again.

Figure 19:
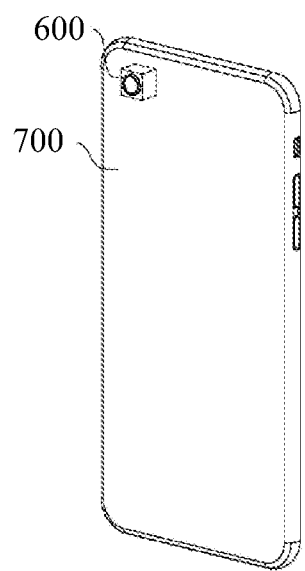
FIG. 19 illustrates a schematic view of an exemplary electronic device according to various embodiments of the present disclosure.

Further, the present disclosure also provides an electronic device. FIG. 19 illustrates a schematic view of an exemplary electronic device according to various embodiments of the present disclosure.

Referring to FIG. 19, the electronic device 700 may include a lens module 600 according to various embodiments of the present disclosure.

The lens module 600 may demonstrate desired reliability and performance, and thus may improve the picture quality, the shooting speed, and the saving speed of the electronic device 700. In addition, the overall thickness of the lens module 600 may be small, which may be conducive to improving the user experience. In one embodiment, the electronic device 700 may be a device with a shooting function, such as a mobile phone, a tablet computer, a camera, a camcorder, etc.

The details of the present disclosure have been described through the embodiments provided above. However, it should be understood that the above embodiments are only for the purpose of illustration and description. Further, those skilled in the art can understand that the present disclosure is not limited to the above embodiments, and various modifications and changes can be made according to the principles of the present disclosure. These modifications and modifications are all in the scope of the present disclosure. The scope of the present disclosure is defined by the appended claims and their equivalents.

What is claimed is:

1. A method for packaging a camera assembly, comprising:
   providing a photosensitive chip having a plurality of first soldering pads;
   mounting a filter on the photosensitive chip;
   providing a first carrier substrate;
   bonding a plurality of functional components and the photosensitive chip to the first carrier substrate, wherein the plurality of functional components has a plurality of second soldering pads, and the plurality of first soldering pads and the plurality of second soldering pads all face away from the first carrier substrate;
   forming an encapsulation layer to cover the first carrier substrate, the photosensitive chip, and the functional components, wherein the encapsulation layer exposes the filter;
   forming a redistribution layer (RDL) structure, on one side of the encapsulation layer close to the filter, to electrically connect to the plurality of first soldering pads and the plurality of second soldering pads; and
   removing the first carrier substrate.

2. The method according to claim 1, wherein forming the RDL structure includes:
   forming a plurality of conductive vias through the encapsulation layer, wherein each conductive via exposes a first soldering pad of the plurality of first soldering pads or a second soldering pad the plurality of second soldering pads;
   forming the RDL structure on a second carrier substrate, wherein the RDL structure includes an interconnection line and a plurality of conductive plugs;

bonding each conductive plug of the plurality of conductive plugs into a conductive via of the plurality of conductive vias to electrically connect to the first soldering pad of the plurality of first soldering pads or the second soldering pad of the plurality of second soldering pads exposed by the conductive via; and removing the second carrier substrate.

3. The method according to claim 2, wherein forming the RDL structure on the second carrier substrate includes:
   forming a dielectric layer on the second carrier substrate;
   patterning the dielectric layer to form an interconnection trench in the dielectric layer;
   filling a conductive material into the interconnection trench, wherein the conductive material also covers a top surface of the dielectric layer;
   forming a patterned mask layer on the conductive material, wherein the patterned mask layer covers a portion of the conductive material at positions of the plurality of conductive plugs;
   etching the conductive material until the dielectric layer is exposed using the patterned mask layer as an etch mask; and
   removing the patterned mask layer and the dielectric layer, wherein:
      the dielectric layer is removed through a reactive ion etching process.

4. The method according to claim 2, wherein forming the RDL structure on the second carrier substrate includes:
   forming a conductive layer on the second carrier substrate;
   etching the conductive layer to form the interconnection line of the RDL structure;
   forming a sacrificial layer to cover the second carrier substrate and the interconnection line;
   patterning the sacrificial layer to form a plurality of vias in the sacrificial layer, wherein the plurality of vias defines positions of the plurality of conductive plugs of the RDL structure;
   forming the plurality of pillars in the plurality of vias; and
   removing the sacrificial layer.

5. The method according to claim 2, wherein forming the encapsulation layer includes:
   after mounting the filter on the photosensitive chip and bonding the plurality of functional components and the photosensitive chip to the first carrier substrate, placing the first carrier substrate into a mold, wherein the mold includes an upper mold and a lower mold, one of the upper mold and the lower mold has a plurality of protruding bosses, the first carrier substrate is placed between the upper mold and the lower mold;
   closing the mold, wherein the mold is pressed onto the first carrier substrate and the filter, each protruding boss of the plurality of protruding bosses is pressed onto a first soldering pad of the plurality of first soldering pads or a second soldering pad of the plurality of second soldering pads, and a cavity is formed between the upper mold and the lower mold;
   injecting a molding material into the cavity to form the encapsulation layer; and
   removing the mold to form the plurality of conductive vias in the encapsulation layer.

6. The method according to claim 2, wherein forming the plurality of conductive vias in the encapsulation layer includes:
   etching the encapsulation layer through a laser etching process to form the plurality of conductive vias.

7. The method according to claim 2, wherein:
   the plurality of conductive plugs is bonded into the plurality of conductive bias through a metal bonding process, wherein parameters adopted in the metal bonding process include:
      a bonding temperature smaller than or equal to 250° C.;
      a pressure greater than or equal to 200 kPa; and
      a bonding time greater than or equal to 30 minutes.

8. The method according to claim 1, wherein forming the encapsulation layer includes:
   after mounting the filter on the photosensitive chip and bonding the plurality of functional components and the photosensitive chip to the first carrier substrate, placing the first carrier substrate into a mold, wherein the mold includes an upper mold and a lower mold, and the first carrier substrate is placed between the upper mold and the lower mold;
   closing the mold, wherein the mold is pressed onto the first carrier substrate and the filter, and a cavity is formed between the upper mold and the lower mold;
   injecting a molding material into the cavity to form the encapsulation layer; and
   removing the mold.

9. The method according to claim 1, wherein:
   the encapsulation layer covers a sidewall of the filter.

10. The method according to claim 9, wherein:
    prior to forming the encapsulation layer, a stress buffer layer is formed through a dispensing process to cover the sidewall of the filter; and
    the encapsulation layer covers the stress buffer layer.

11. The method according to claim 1, wherein:
    after mounting the filter on the photosensitive chip, the photosensitive chip is bonded to the first carrier substrate.

12. The method according to claim 1, wherein:
    the first carrier substrate is removed after forming the RDL structure to electrically connect to the plurality of first soldering pads and the plurality of second soldering pads.

13. The method according to claim 1, wherein after forming the RDL structure to electrically connect to the plurality of first soldering pads and the plurality of second soldering pads, further including:
    bonding a flexible printed circuit (FPC) board to the RDL structure.

14. A camera assembly, comprising:
    an encapsulation layer;
    a photosensitive unit and a plurality of functional components embedded in the encapsulation layer, wherein:
       the photosensitive unit includes a photosensitive chip, and a filter mounted on the photosensitive chip,
       a bottom surface of the encapsulation layer exposes the photosensitive chip and the plurality of functional components, and
       the photosensitive chip has a plurality of first soldering pads, the plurality of functional components has a plurality of second soldering pads, and the plurality of first soldering pads and the plurality of second soldering pads all face away from a first carrier substrate;
    a redistribution layer (RDL) structure, located on one side of the encapsulation layer close to the filter and electrically connected to the plurality of first soldering pads and the plurality of second soldering pads.

15. The camera assembly according to claim 14, wherein the RDL structure includes:
 a plurality of conductive plugs located in the encapsulation layer, wherein each conductive plug of the plurality conductive plugs is electrically connected to a first soldering pad of the plurality of first soldering pads or a second soldering pad of the plurality of second soldering pads; and
 an interconnection line, located on a top surface of the encapsulation layer, and electrically connected to the plurality of conductive plugs.

16. The camera assembly according to claim 14, wherein:
 the plurality of functional components includes at least one of a peripheral chip and a passive component, wherein the peripheral chip includes one or both of a digital signal processor and a memory.

17. The camera assembly according to claim 14, further including:
 an FPC board, located on a top surface of the RDL structure.

18. A lens module, comprising:
 the camera assembly according to claim 14; and
 a lens assembly, including a holder, wherein the holder is mounted on a top surface of the encapsulation layer and surrounds the photosensitive chip and the plurality of functional components, and the lens assembly is electrically connected to the photosensitive chip and the plurality of functional components.

19. An electronic device, comprising:
 the lens module according to claim 18.

20. A camera assembly, comprising:
 an encapsulation layer;
 a photosensitive unit and a plurality of functional components embedded in the encapsulation layer, wherein:
  the photosensitive unit includes a photosensitive chip, and a filter mounted on the photosensitive chip,
  a bottom surface of the encapsulation layer exposes the photosensitive chip and the plurality of functional components,
  the photosensitive chip has a plurality of first soldering pads, the plurality of functional components has a plurality of second soldering pads, and the plurality of first soldering pads and the plurality of second soldering pads all face away from a first carrier substrate;
  a redistribution layer (RDL) structure, located on one side of the encapsulation layer close to the filter and electrically connected to the plurality of first soldering pads and the plurality of second soldering pads
 the encapsulation layer covers a sidewall of the filter;
 the camera assembly includes a stress buffer layer formed on a sidewall of the filter; and
 the stress buffer layer is located between the encapsulation layer and the sidewall of the filter.

* * * * *